US010794941B2

United States Patent
Ojima

(10) Patent No.: US 10,794,941 B2
(45) Date of Patent: Oct. 6, 2020

(54) ABNORMALITY DIAGNOSIS APPARATUS AND ABNORMALITY DIAGNOSIS METHOD

(71) Applicant: TOYOTA JIDOSHA KABUSHIKI KAISHA, Toyota-shi, Aichi-ken (JP)

(72) Inventor: Kenji Ojima, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 351 days.

(21) Appl. No.: 15/946,053

(22) Filed: Apr. 5, 2018

(65) Prior Publication Data

US 2018/0348269 A1 Dec. 6, 2018

(30) Foreign Application Priority Data

Jun. 5, 2017 (JP) ................................ 2017-110747

(51) Int. Cl.

*G01R 23/16* (2006.01)
*G06N 20/00* (2019.01)
*G01R 19/25* (2006.01)
*G06K 9/62* (2006.01)
*G06T 7/00* (2017.01)
*G06K 9/00* (2006.01)
*G01R 31/367* (2019.01)

(52) U.S. Cl.

CPC ......... *G01R 23/16* (2013.01); *G01R 19/2506* (2013.01); *G06K 9/0055* (2013.01); *G06K 9/6262* (2013.01); *G06N 20/00* (2019.01); *G06T 7/001* (2013.01); *G01R 31/367* (2019.01); *G06T 2207/30108* (2013.01)

(58) Field of Classification Search

USPC ........................................................ 702/71

See application file for complete search history.

(56) References Cited

U.S. PATENT DOCUMENTS

| | | | | |
|---|---|---|---|---|
| 6,952,662 | B2 * | 10/2005 | Wegerich | G06F 17/10 700/29 |
| 8,700,550 | B1 * | 4/2014 | Bickford | G06N 3/004 706/14 |
| 2007/0093985 | A1 | 4/2007 | Mizoguchi et al. | |
| 2012/0041575 | A1 * | 2/2012 | Maeda | G05B 23/024 700/80 |

(Continued)

FOREIGN PATENT DOCUMENTS

| | | |
|---|---|---|
| JP | 2007-101243 A | 4/2007 |
| JP | 2010-049533 A | 3/2010 |

*Primary Examiner* — Paul D Lee

(74) *Attorney, Agent, or Firm* — Oliff PLC

(57) ABSTRACT

An abnormality diagnosis apparatus includes a time series data obtaining unit for obtaining test data and variable data, the test data being obtained from the test object over a predetermined period of time and being time series data of a predetermined attribute value that dictates whether an abnormality is present in the test object, and the variable data corresponding to the test data for the predetermined period of time and being time series data regarding a variable affecting the attribute value, a superimposed image generating unit for superimposing a waveform of the test data and a waveform of the variable data to generate superimposed image data, and a determining unit for determining whether an abnormality is present in the test object based on the superimposed image data generated by the superimposed image generating unit.

13 Claims, 8 Drawing Sheets

SUPERIMPOSED IMAGE

(56) References Cited

U.S. PATENT DOCUMENTS

2012/0237081 A1* 9/2012 Datta ................. G06K 9/00785
382/103
2014/0195184 A1* 7/2014 Maeda ................... G05B 21/02
702/85
2015/0363925 A1* 12/2015 Shibuya ............... G06K 9/6272
345/440
2018/0210942 A1* 7/2018 Patil .................... G06F 16/2477
2018/0219889 A1* 8/2018 Oliner ...................... G06N 3/08

* cited by examiner

ABNORMALITY DIAGNOSIS APPARATUS AND ABNORMALITY DIAGNOSIS METHOD

CROSS REFERENCE TO RELATED APPLICATIONS

This application is based upon and claims the benefit of priority from Japanese patent application No. 2017-110747, filed on Jun. 5, 2017, the disclosure of which is incorporated herein in its entirety by reference.

BACKGROUND

The present disclosure relates to an abnormality diagnosis apparatus and an abnormality diagnosis method.

A technique for diagnosing an apparatus for an abnormality based on data output from the apparatus is known. For example, Japanese Unexamined Patent Application Publication No. 2010-049533 discloses a technique for assisting a determination of whether an abnormality is present in a test object by displaying a waveform image of plant data obtained from sensors in a plant. Japanese Unexamined Patent Application Publication No. 2007-101243 discloses determining whether an abnormality is present in a test object based on a feature of waveform data output from the test object.

SUMMARY

The techniques disclosed in these documents determine whether an abnormality is present in the test object only based on a waveform of a predetermined attribute value that dictates whether an abnormality is present in the test object. However, as this attribute value is affected by another condition, an accurate determination of whether an abnormality is present in the test object is difficult to make only from the waveform of this attribute value. For this reason, preferably the determination is made taking the other condition into consideration. There may be a plurality of such conditions. If there are a plurality of such conditions, the determination method may become complicated, as the determination of whether an abnormality is present is present in the test object needs to be made taking all the conditions into consideration.

The present disclosure has been made in light of the above-described circumstances. An object of the present disclosure is to provide an abnormality diagnosis apparatus and an abnormality diagnosis method capable of easily and accurately diagnosing a test object for an abnormality.

An example aspect of the present disclosure to achieve the above purpose is an abnormality diagnosis apparatus for diagnosing a test object for an abnormality. The abnormality diagnosis apparatus includes: time series data obtaining means for obtaining test data and variable data, the test data being obtained from the test object over a predetermined period of time and being time series data of a predetermined attribute value that dictates whether an abnormality is present in the test object, and the variable data corresponding to the test data for the predetermined period of time and being time series data regarding a variable affecting the attribute value; superimposed image generating means for superimposing a waveform of the test data and a waveform of the variable data to generate superimposed image data; and determining means for determining whether an abnormality is present in the test object based on a level of similarity between the superimposed image data to which an abnormality or normal determination value is given in advance and the superimposed image data generated by the superimposed image generating means.

This abnormality diagnosis apparatus makes the determination using not only the waveform data (the test data) of the predetermined attribute value that dictates whether an abnormality is present in the test object but also the waveform data (the variable data) of the variable affecting the attribute value. This achieves determination more accurate than the determination using only the test data. This determination also includes a determination of whether an abnormality is present in the test object based on the level of similarity in the image obtained by superimposing the test data and the variable data. Thus, no specific analysis regarding the relationship between the test data and the variable data is necessary, thereby enabling the determination easy.

In the above example aspect, the determining means makes the determination using a determination model learned using the superimposed image data to which the abnormality or normal determination value is given in advance. The abnormality diagnosis apparatus may further include determination model updating means for updating the determination model based on a determination result of the test object, which has been subjected to the determination by the determining means, by another abnormality determination method different from a determination method performed by the determining means.

This allows more accurate determination results to be reflected to the determination model and thus enhances the determination accuracy of the abnormality diagnosis apparatus.

In the above example aspect, the determination model updating means may update the determination model based on a determination result obtained by the other abnormality determination method performed on the test object having the level of similarity less than a predetermined reference value.

This enhances the determination accuracy for data with particularly low determination accuracy.

In this example aspect, the test data and the variable data may be the time series data during an operation of the test object in the predetermined period of time.

In this case, it is possible to determine whether an abnormality is present in the test object from various values occurring during the operation of the test object.

In the above example aspect, the variable data may be the time series data of a value indicating a control state for predetermined processing performed on the test object, and the test data may be the time series data of a value indicating a state of the test object after the predetermined processing.

Thus, it is possible to perform a diagnosis taking processing conditions that affect the state of the processed test object into consideration.

Another aspect of the present disclosure to achieve the above purpose is an abnormality diagnosis method for diagnosing a test object for an abnormality. The abnormality diagnosis method includes: obtaining test data and variable data, the test data being obtained from the test object over a predetermined period of time and being time series data of a predetermined attribute value that dictates whether an abnormality is present in the test object, and the variable data corresponding to the test data for the predetermined period of time and being time series data regarding a variable affecting the attribute value; superimposing a waveform of the test data and a waveform of the variable data to generate superimposed image data; and determining whether an abnormality is present in the test object based on a level of similarity between the superimposed image data to which an abnormality or normal determination value is given in advance and the generated superimposed image data.

This abnormality diagnosis method makes the determination using not only the waveform data (the test data) of the predetermined attribute value that dictates whether an abnormality is present in the test object but also the waveform data (the variable data) of the variable affecting the attribute value. This achieves a determination more accurate than the determination using only the test data. This determination also includes a determination of whether an abnormality is present in the test object based on the level of similarity in the image obtained by superimposing the test data and the variable data. Thus, no specific analysis regarding the relationship between the test data and the variable data is necessary, thereby enabling the determination easy.

In the above example aspect, the abnormality diagnosis method may further include determining whether the abnormality is present in the test object having the level of similarity less than a predetermined reference value among a plurality of the test objects by another abnormality determination method different from a determination method based on the level of similarity in the superimposed image data.

Thus, this method performs the other abnormality determination method only on some test objects having low determination accuracy among all the test objects, which have been subjected to the determination based on the level of similarity in the superimposed image data. This enables an efficient abnormality determination.

The present disclosure can provide an abnormality diagnosis apparatus and an abnormality diagnosis method capable of easily and accurately diagnosing a test object for an abnormality.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Figure 1:
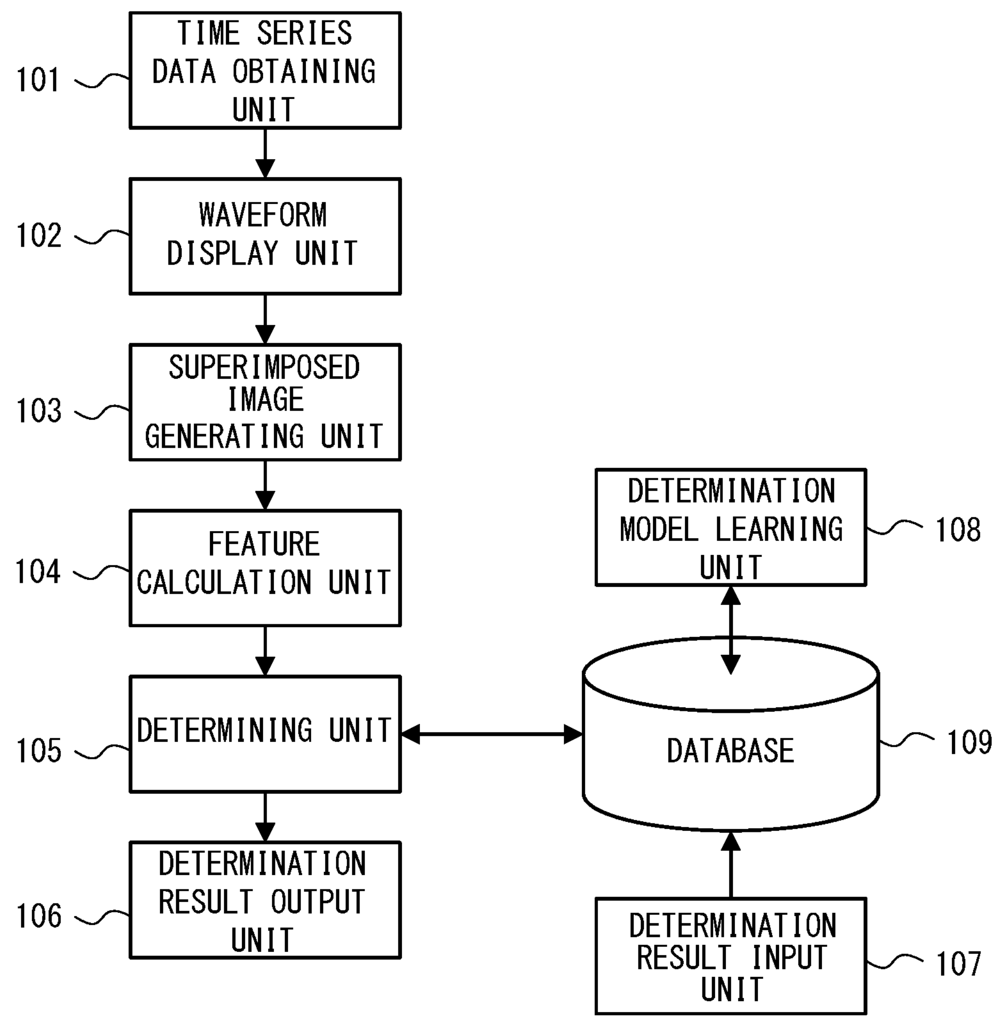
FIG. 1 is a block diagram showing an example of a functional configuration of an abnormality diagnosis apparatus according to an embodiment.
Figure 2:
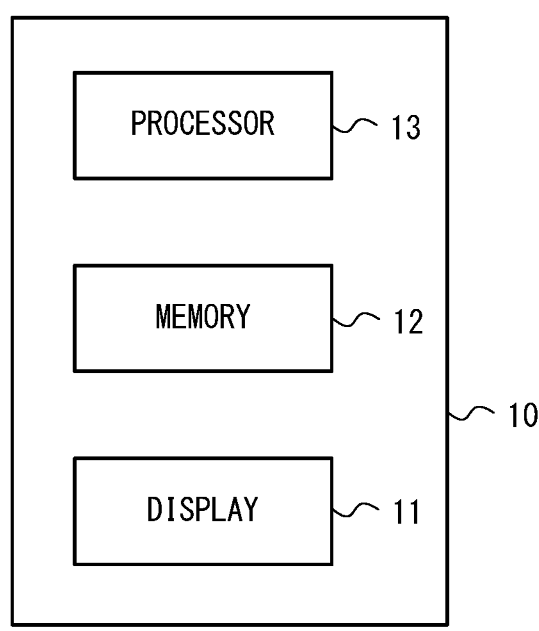
FIG. 2 is a block diagram showing an example of a hardware configuration of the abnormality diagnosis apparatus according to the embodiment.

Hereinafter, an embodiment of the present disclosure will be described with reference to the drawings. FIG. 1 is a block diagram showing an example of a functional configuration of an abnormality diagnosis apparatus 10 according to the embodiment. FIG. 2 is a block diagram showing an example of a hardware configuration of an abnormality diagnosis apparatus 10 according to the embodiment.

The abnormality diagnosis apparatus 10 diagnoses a test object for an abnormality. As shown in FIG. 1, the abnormality diagnosis apparatus 10 includes a time series data obtaining unit 101, a waveform display unit 102, a superimposed image generating unit 103, a feature calculating unit 104, a determining unit 105, a determination result output unit 106, a determination result input unit 107, a determination model learning unit 108, and a database 109.

The time series data obtaining unit (time series data obtaining means) 101 obtains test data and variable data. The test data is time series data obtained from the test object over a predetermined period of time (hereinafter referred to as a detection period), and is also time series data of a predetermined attribute value that dictates whether an abnormality is present in the test object. The test data may be, for example, data composed of time series data of an output value or a state value during an operation of the test object or composed of time series data when a predetermined measurement is performed on the test object. The variable data is time series data of a variable affecting the above-mentioned attribute value. Note that the variable data obtained by the time series data obtaining unit 101 is time series data corresponding to the test data in the detection period.

For example, the test data and the variable data are the time series data during an operation of the test object in the detection period. Alternatively, for example, the variable data is the time series data of a value indicating a control state for predetermined processing performed on the test object, and the test data is the time series data of a value indicating the state of the test object after the predetermined processing.

The time series data obtaining unit 101 may obtain the time series data of a plurality of variables as the variable data. The time series data obtaining unit 101 may obtain the time series data of a plurality of attribute values as the test data.

The time series data obtaining unit 101 may obtain the time series data by any method. For example, the time series data obtaining unit 101 may directly obtain the time series data from the test object connected to the abnormality diagnosis apparatus 10, from a measuring device connected to the test object, or from a recording medium by reading the time series data recorded therein. Alternatively, the time series data obtaining unit 101 may obtain the time series data via a network connected by a wire or wirelessly.

The waveform display unit 102 displays the waveform of the time series data obtained by the time series data obtaining unit 101 on the display 11. The waveform display unit 102 superimposes the waveforms of the respective time series data pieces obtained by the time series data obtaining unit 101 and displays the superimposed waveform.

The superimposed image generating unit (superposed image generating means) 103 generates superimposed image data, which is image data obtained by superimposing the waveforms of the test data and the variable data. That is, the superimposed image generating unit 103 superimposes all the waveform images of the respective time series data pieces obtained by the time series data obtaining unit 101 to generate the image data. The superimposed image generating unit 103 stores the image displayed by the waveform display unit 102 in the memory 12 as the image data. Then, the superimposed image data is generated. The superimposed image generating unit 103 may generate the above-described superimposed image data by any method. This generation method may be any method.

The feature calculating unit 104 calculates a predetermined feature of the superimposed image data generated by the superimposed image generating unit 103. Note that the predetermined feature calculated here is an image feature corresponding to a determination model used in the determining unit 105. Specifically, this image feature is, for example, Grid Fourier or Line Direction, although the image feature is not limited to them.

The determining unit (determining means) 105 determines whether an abnormality is present in the test object based on a level of similarity between the superimposed image data to which an abnormality or normal determination value is given in advance and the superimposed image data generated by the superimposed image generating unit 103 for the test object. Specifically, the determining unit 105 makes the determination based on the level of similarity using a determination model, which has been learned using the superimposed image data pieces to which the abnormality or normal determination values are given, respectively, in advance. The determination model is learned using the features of a large number of superimposed image data pieces to which the abnormality or normality determination values are given, respectively, in advance. Note that the superimposed image data used for the learning includes the variable data of the same variable as that of the variable data obtained by the time series data obtaining unit 101 from the test object, and the test data of the same attribute as that of the test data obtained by the time series data obtaining unit 101 from the test object. One of the abnormal and normal determination values is associated with each of the superimposed image data pieces used for the learning based on the determination result obtained by, for example, another abnormality determination method.

The determination model is, for example, a model generated using any machine learning. Examples of such a determination model include, but are not limited to, random forest, SVM (Support Vector Machine), deep learning, and the like.

Specifically, the determining unit 105 reads the determination model stored in the database 109, and receives the feature calculated by the feature calculating unit 104 for the determination model to thereby determine whether the test object is abnormal or normal. When the database 109 stores a plurality of determination models, only the determination model corresponding to the current inspection content is read to make the determination. For example, the determining unit 105 determines the determination value using the determination model as follows. The determining unit 105 selects the determination value for the test object from among the plurality of superimposed image data pieces to which the determination values are given, respectively, in advance. Specifically, the determining unit 105 selects the determination value that is associated with the superimposed image data having the level of similarity, which is the similarity between the superimposed image data of the determination value and the superimposed image data of the test object, greater than or equal to a predetermined reference value and also highest among the plurality of superimposed image data pieces to which the determination values are given, respectively, in advance (i.e., the determination value indicates normal or abnormal).

The determination result output unit 106 outputs a determination result, which is the determination value, determined by the determining unit 105. For example, the determination result output unit 106 outputs the determination value to the display 11.

The determination result input unit 107 receives an input of the determination result obtained by another abnormality determination method different from the determination method performed by the determining unit 105. That is, the determination result input unit 107 receives an input of the determination result obtained by another abnormality determination method for the test object, which has been subjected to the above determination by the determining unit 105. The other abnormality determination method is, for example, any abnormality determination method with higher determination accuracy than that of the determination made by the determining unit 105. The determination result input unit 107 may receive an input from a user or may receive a determination result transmitted from another abnormality diagnosis apparatus or the like. The determination result input unit 107 stores the received determination result in the database 109 in association with the superimposed image data of the test object or its feature.

The determination model learning unit (determination model updating means) 108 learns the determination model using the superimposed image data pieces to which the abnormality or normality determination values have been given, respectively, in advance. The determination model learning unit 108 updates the determination model based on the determination result input to the determination result input unit 107. This allows more accurate determination results obtained by, for example, the other abnormality diagnosis method to be reflected to the determination model and thus enhances the determination accuracy of the abnormality diagnosis apparatus 10.

The database 109 stores various data pieces used for the determination processing. Specifically, the database 109 stores the superimposed image data used for learning the determination models, the determination values associated with the superposed image data, and the determination models. When the determination result input unit 107 receives the input, the determination result obtained by the determination result input unit 107 and the superimposed image data corresponding to the determination result are stored in the database 109.

Next, an example of a hardware configuration of the abnormality diagnosis apparatus 10 will be described. As shown in FIG. 2, the abnormality diagnosis apparatus 10 includes a display 11, a memory 12, and a processor 13.

The display 11 is a display apparatus that displays any image and may be, for example, a flat panel display such as a Liquid Crystal Display (LCD), a plasma display, or an organic Electro-Luminescence (EL) display.

The memory 12 is composed of a combination of a volatile memory and a non-volatile memory. The memory 12 may include a storage physically separated from the processor 13. In this case, the processor 13 may access the memory 12 via an input and output interface (not shown). The memory 12 is used to store software (computer program) and the like to be executed by the processor 13.

The processor 13 reads the software (computer program) from the memory 12 and executes it to thereby achieve the time series data obtaining unit 101, the waveform display unit 102, the superimposed image generating unit 103, the feature calculating unit 104, the determining unit 105, the determination result output unit 106, the determination result input unit 107, and the determination model learning unit 108. As described above, the abnormality diagnosis apparatus 10 has a function as a computer. The processor 13 may be, for example, a microprocessor, an MPU, or a CPU. The processor 13 may include a plurality of processors.

The above-mentioned program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

The database 109 may be implemented by a storage apparatus such as the memory 12. In this embodiment, the configuration in which the abnormality diagnosis apparatus 10 includes the database 109 is shown as an example. However, the database 109 may be provided separately from the abnormality diagnosis apparatus 10. That is, the abnormality diagnosis apparatus 10 may obtain information from the database 109 provided in another apparatus.

Further, the time series data obtaining unit 101, the waveform display unit 102, the superimposed image generating unit 103, the feature calculating unit 104, the determining unit 105, the determination result output unit 106, the determination result input unit 107, and the determination model learning unit 108 may not be implemented by software for executing a program and instead may be implemented by, for example, hardware circuits or a combination of hardware, firmware, and software.

Figure 3:
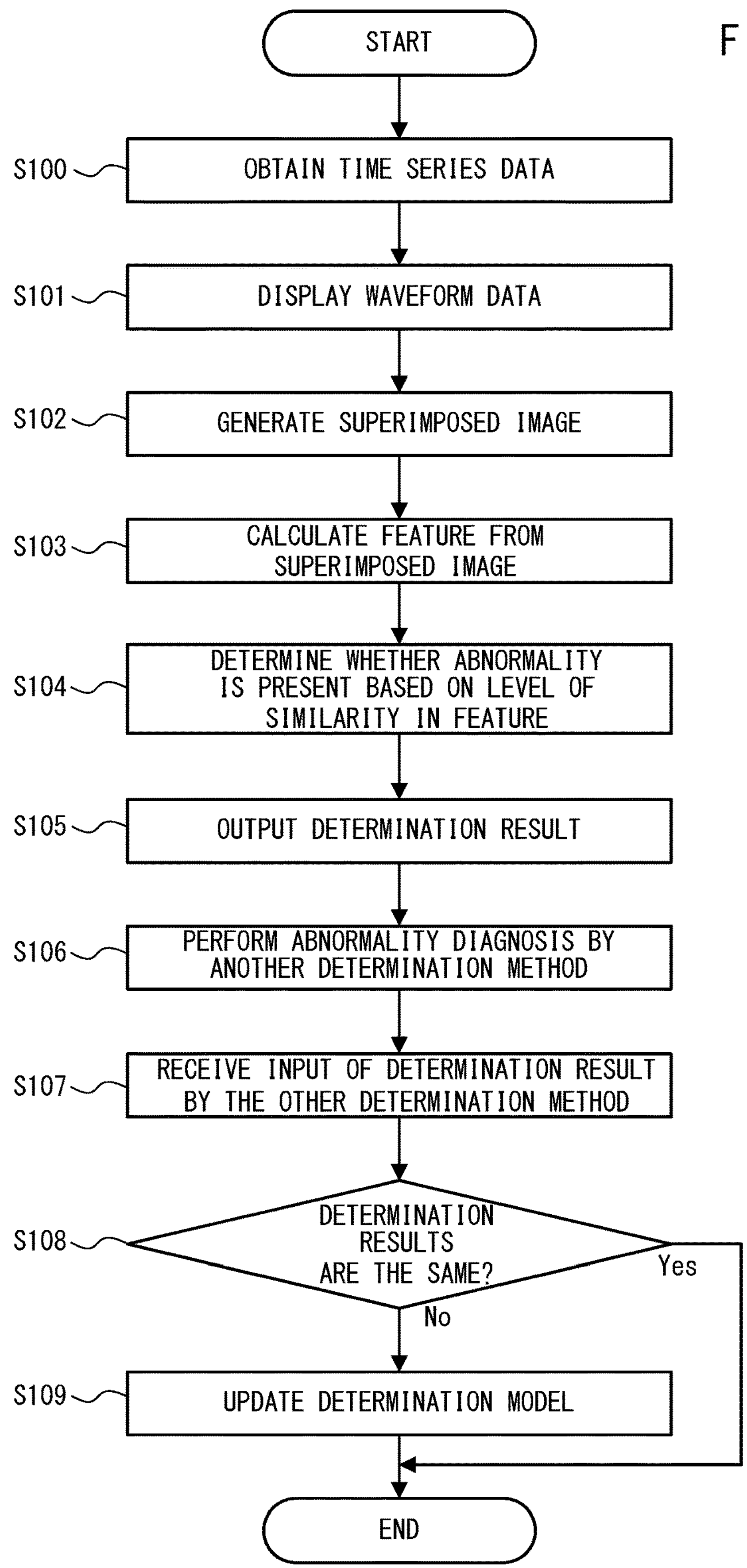
FIG. 3 is a flowchart showing an example of a flow of an abnormality diagnosis method using the abnormality diagnosis apparatus according to the embodiment.

Next, an abnormality diagnosis method using the abnormality diagnosis apparatus 10 will be described. FIG. 3 is a flowchart showing an example of a flow of the abnormality diagnosis method using the abnormality diagnosis apparatus 10. Hereinafter, an example of the flow of the abnormality diagnosis method will be described with reference to the flowchart shown in FIG. 3.

In Step 100 (S100), the time series data obtaining unit 101 obtains the time series data of the test data and the variable data.

Next, in Step 101 (S101), the waveform display unit 102 displays the waveform of the time series data obtained in Step 100 on the display 11.

Next, in Step 102 (S102), the superimposed image generating unit 103 superimposes the waveforms of the test data and the variable data to generate the image data.

Next, in Step 103 (S103), the feature calculating unit 104 calculates a predetermined feature of the image data generated in Step 102.

Next, in Step 104 (S104), the determining unit 105 determines whether an abnormality is present in the test object based on the level of similarity in the feature. Specifically, the determining unit 105 applies the feature calculated in Step 103 to the determination model that has been learned in advance, and determines whether an abnormality is present in the test object.

Next, in Step 105 (S105), the determination result output unit 106 displays the determination result obtained in Step 104 on the display 11.

Next, in Step 106 (S106), the test object, which has been subjected to the determination in Step 104, is diagnosed by the other abnormality determination method. Note that this diagnosis is performed through a test by a person or by an apparatus different from the abnormality diagnosis apparatus 10. In the flowchart shown in FIG. 3, the diagnosis by the other abnormality determination method is performed after Step 105. However, it may be performed before Step 105.

Next, in Step 107 (S107), the determination result input unit 107 receives the input of the determination result obtained by the diagnosis in Step 106.

Next, in Step 108 (S108), the determination model learning unit 108 determines whether the determination result obtained in Step 104 is the same as the determination result input in Step 107. If these two determination results are the same, the method ends. After this step, if there is another test object, the above-described flow is performed for the test object.

When these two determination results are different, in Step 109 (S109), the determination model learning unit 108 updates the determination model using the determination result input in Step 107. After that, the method ends. After this step, if there is another test object, the above-described flow is performed for the test object.

Figure 4:
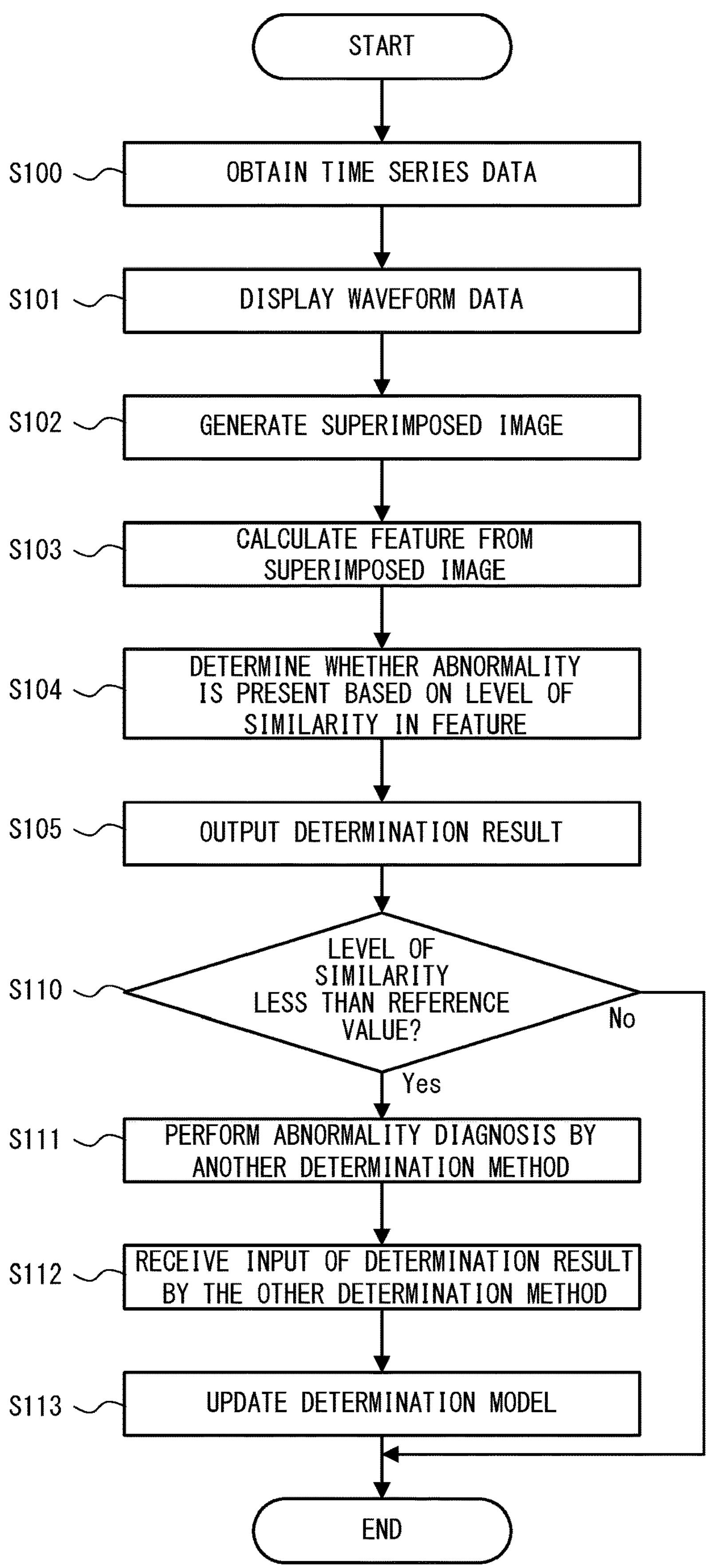
FIG. 4 is a flowchart showing another example of a flow of the abnormality diagnosis method using the abnormality diagnosis apparatus according to the embodiment.

Although the abnormality diagnosis method using the abnormality diagnosis apparatus 10 has been described with reference to FIG. 3, an abnormality diagnosis method shown in FIG. 4 may be carried out. FIG. 4 is a flowchart showing another example of the flow of the abnormality diagnosis method using the abnormality diagnosis apparatus 10. Hereinafter, another example of the flow of the abnormality diagnosis method will be described with reference to the flowchart shown in FIG. 4. In the flowchart shown in FIG. 4, Step 100 to Step 105 are the same as those of the flowchart shown in FIG. 3. Thus, the flow after Step 105 will be described.

In the flowchart shown in FIG. 4, Step 110 is performed after Step 105. In Step 110 (S110), the determining unit 105 determines whether the level of similarity, which is the similarity between the superimposed image data of the test object and the superimposed image data to which the abnormality or normality determination value has been given in advance, is less than a predetermined reference value. When the level of similarity is equal to or greater than the reference value, the method ends. After this step, if there is another test object, the above-described flow is performed for the test object.

When the level of similarity is less than the reference value, in Step 111 (S111), like in Step 106, the diagnosis is performed on the test object, which has been subjected to the determination in Step 104, by the other abnormality determination method. That is, this method determines whether an abnormality is present in the test object having the level of similarity less than the predetermined reference value among the plurality of test objects by the abnormality determination method different from the determination method that is based on the level of similarity in the superimposed image data. In other words, this method diagnoses only the test object having the level of similarity less than the predetermined reference value by the other abnormality diagnosis method, instead of diagnosing all the test objects tested by the abnormality diagnosis apparatus 10. Thus, this method performs the other abnormality determination method only on some test objects having low determination accuracy among all the test objects, which have been subjected to the determination based on the level of similarity in the superimposed image data. This enables an efficient abnormality determination.

Next, in Step 112 (S112), like in Step 107, the determination result input unit 107 receives the input of the determination result obtained by the diagnosis in Step 111.

Next, in Step 113 (S113), like in Step 109, the determination model learning unit 108 updates the determination model using the determination result input in Step 112. After that, the method ends. After this step, if there is another test object, the above-described flow is performed for the test object.

In this manner, with this method, the determination model learning unit 108 updates the determination model based on the determination result obtained by the other abnormality determination method for the test object having the level of similarity less than the predetermined reference value. Therefore, this method can enhance the determination accuracy of data with particularly low determination accuracy.

Next, a specific example of the diagnosis of the test object using the abnormality diagnosis apparatus 10 will be described. A first example (see FIG. 5) is an example of a diagnosis by a voltage measurement test of a product 20, which is the test object. In the example shown in FIG. 5, the product 20 is, for example, a fuel cell, although the product to be tested is not limited to this.

Figure 5:
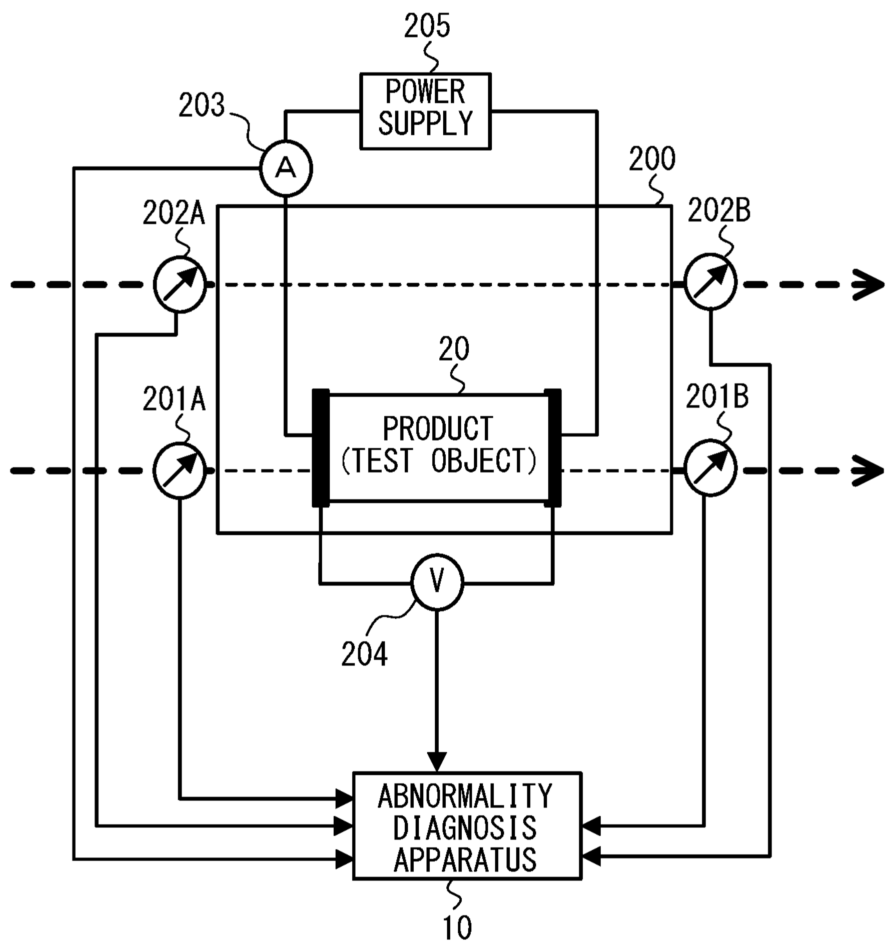
FIG. 5 is a schematic diagram showing a first specific example of a diagnosis using the abnormality diagnosis apparatus according to the embodiment.

In this example, as shown in FIG. 5, the product 20 is attached to a measuring apparatus 200 that measures the time series data of the test data and the variable data. The measuring apparatus 200 measures the time series data by pressure gauges 201A and 201B, thermometers 202A and 202B, an ammeter 203, and a voltmeter 204. The pressure gauge 201A measures the pressure on an input side of reaction gas, which is necessary for power generation of the product 20. The pressure gauge 201B measures the pressure on an output side of the reaction gas, which is necessary for power generation of the product 20. The thermometer 202A measures the water temperature on an input side of cooling water for cooling the product 20 at the time of power generation. The thermometer 202B measures the water temperature on an output side of the cooling water for cooling the product 20 at the time of power generation. The ammeter 203 measures a current value of current supplied to the product 20 by a power supply 205. The voltmeter 204 measures a voltage value obtained from the power generation by the product 20.

The measurement values of the pressure gauges 201A and 201B, the thermometers 202A and 202B, and the ammeter 203 are related to the measurement value of the voltmeter 204. That is, the time series data of the measurement values of the pressure gauges 201A and 201B, the thermometers 202A and 202B, and the ammeter 203 corresponds to the variable data. Further, the measurement value of the voltmeter 204 corresponds to the test data. That is, in this specific example, a voltage is an attribute value that dictates whether an abnormality is present in the product 20. Each of the measurement values is input to the abnormality diagnosis apparatus 10. Therefore, in the example shown in FIG. 5, the time series data obtaining unit 101 obtains the time series data of the respective measurement values (i.e., the time series data transmitted from the pressure gauges 201A and 201B, the thermometers 202A and 202B, the ammeter 203, and the voltmeter 204) in a period from a first time t1 to a second time t2, which is the period (test period) in which the product 20 is operating for the test. As mentioned above, in the example shown in FIG. 5, the test data and the variable data are the time series data during an operation of the test object in the detection period. Thus, the variable data is the time series data corresponding to the test data in the detection period.

Figure 6:
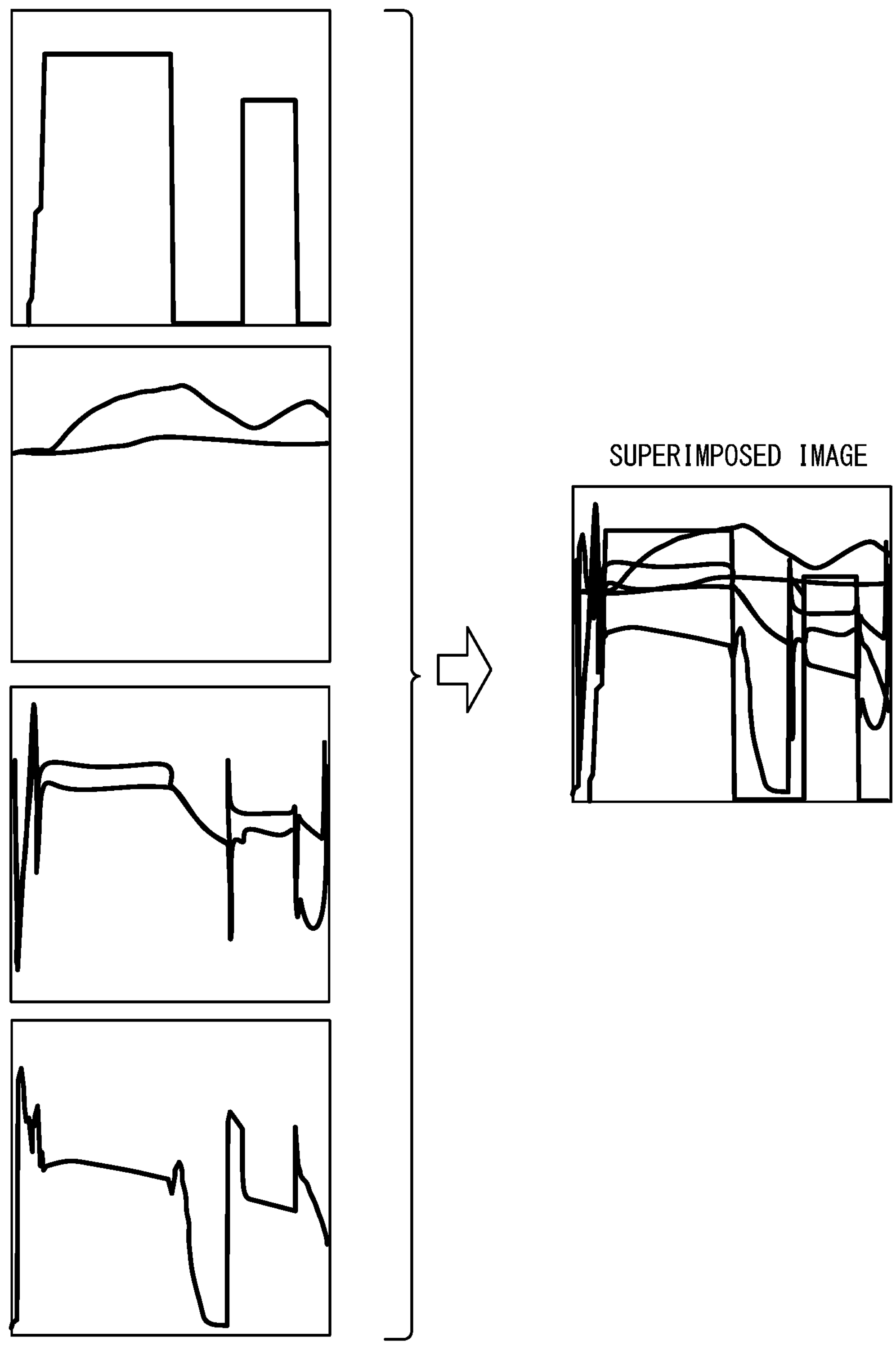
FIG. 6 is a schematic diagram showing an example of image data generated by a superimposed image generating unit.

FIG. 6 is a schematic diagram showing an example of the image data generated by the superimposed image generating unit 103. Among the images shown in FIG. 6, the four images on the left side are images showing waveforms of the respective time series data pieces obtained by the time series data obtaining unit 101. The first image from the top on the left side is an image of the waveform showing the measurement value of the ammeter 203. The second image from the top on the left side is an image of the waveform showing the measurement values of the thermometers 202A and 202B. The third image from the top on the left side is an image of the waveform showing the measurement values of the pressure gauges 201A and 201B. The fourth image from the top on the left side is an image of the waveform showing the measurement value of the voltmeter 204. The image obtained by superimposing the waveforms of these images is shown on the right side of FIG. 6. The feature calculating unit 104 calculates a feature of this superimposed image, and the determining unit 105 determines whether an abnormality is present in the product 20 based on the calculated feature.

As described above, in this specific example, the test data and the variable data are the time series data during an operation of the test object in the predetermined period of time. This makes it possible to determine whether an abnormality is present in the test object from various values occurring during the operation of the test object. Specifically, an abnormality of the voltage during the operation, i.e., an abnormality in the product 20, can be determined taking the current value, the temperature value, and the pressure value during the operation into consideration. In this specific example, a fuel cell is used as an example of the test object, although any product may be diagnosed.

Next, another specific example will be described. A second example (see FIG. 7) is an example of diagnosing whether an abnormality is present as a result of processing by robots 300A to 300D on a product 30, which is a test object. In the example shown in FIG. 7, the product 30 is, for example, a body of a car, although the product to be tested is not limited to this. An application of a paint to the body is described as an example of the operation of the processing, although the operation of the processing is not limited to this.

Figure 7:
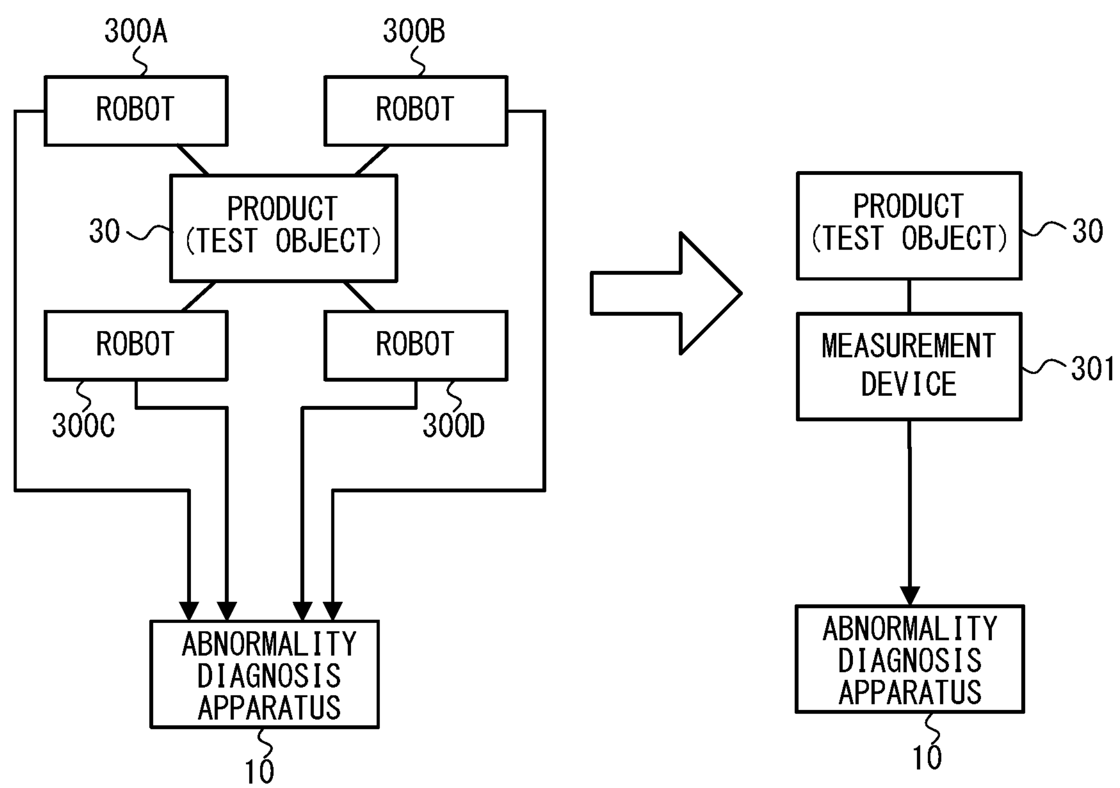
FIG. 7 is a schematic diagram showing a second specific example of a diagnosis using the abnormality diagnosis apparatus according to the embodiment.

In this example, as shown in FIG. 7, the robot 300A to 300D perform processing of applying a paint to the product 30. The values of parameters indicating the control states of the robots 300A to 300D during the processing are input to the abnormality diagnosis apparatus 10 as the variable data. Examples of these parameters include, but not limited to, a rotation angle of a shaft for changing an orientation of a paint nozzle. For example, the parameter may be a quantity of the paint to be supplied. Thus, the time series data of the values of the parameters when the robots 300A to 300D perform the processing is obtained by the time series data obtaining unit 101.

The values of the parameters of the robots 300A to 300D are related to the result of the processing (in this example, the result of the processing is a film thickness of the coating film). That is, the time series data of the values of the parameters of the robots 300A to 300D correspond to the variable data. Further, the film thickness, which is obtained as a result of the processing, corresponds to the test data. That is, in this specific example, the film thickness is an attribute value that dictates whether an abnormality is present in the product 30. The test data can be obtained by measuring the processed product 30. The film thickness is measured by a film thickness sensor (a measuring device 301) after the processing. The film thicknesses are sequentially measured by the sensor at respective positions of the painted area. Each measurement value constitutes the time series data. This time series data is obtained also by the time series data obtaining unit 101 as the test data. In the example shown in FIG. 7, the variable data obtained by the time series data obtaining unit 101 is time series data of a value indicating a control state for predetermined processing performed on the product 30, which is the test object, and the test data obtained by the time series data obtaining unit 101 is time series data of a value indicating a state of the product 30 after the predetermined processing.

The test data here is a measurement value obtained by consecutive measurements of the respective positions at a predetermined pace. For example, the robots 300A to 300D perform the processing in a first period, and the measurements after the processing are performed in a second period. In this case, the variable data is the time series data in the first period, and the test data is the time series data in the second period. However, the second period, i.e., the detection period, is a period necessary for the measurement of the result of the processing, which is performed in the first period. In other words, the variable data in the first period is also the time series data corresponding to the test data in the second period (the detection period). Note that the variable data and the test data may be obtained concurrently. That is, for example, the test data of the processed area may be obtained while the processing operation is in progress.

Figure 8:
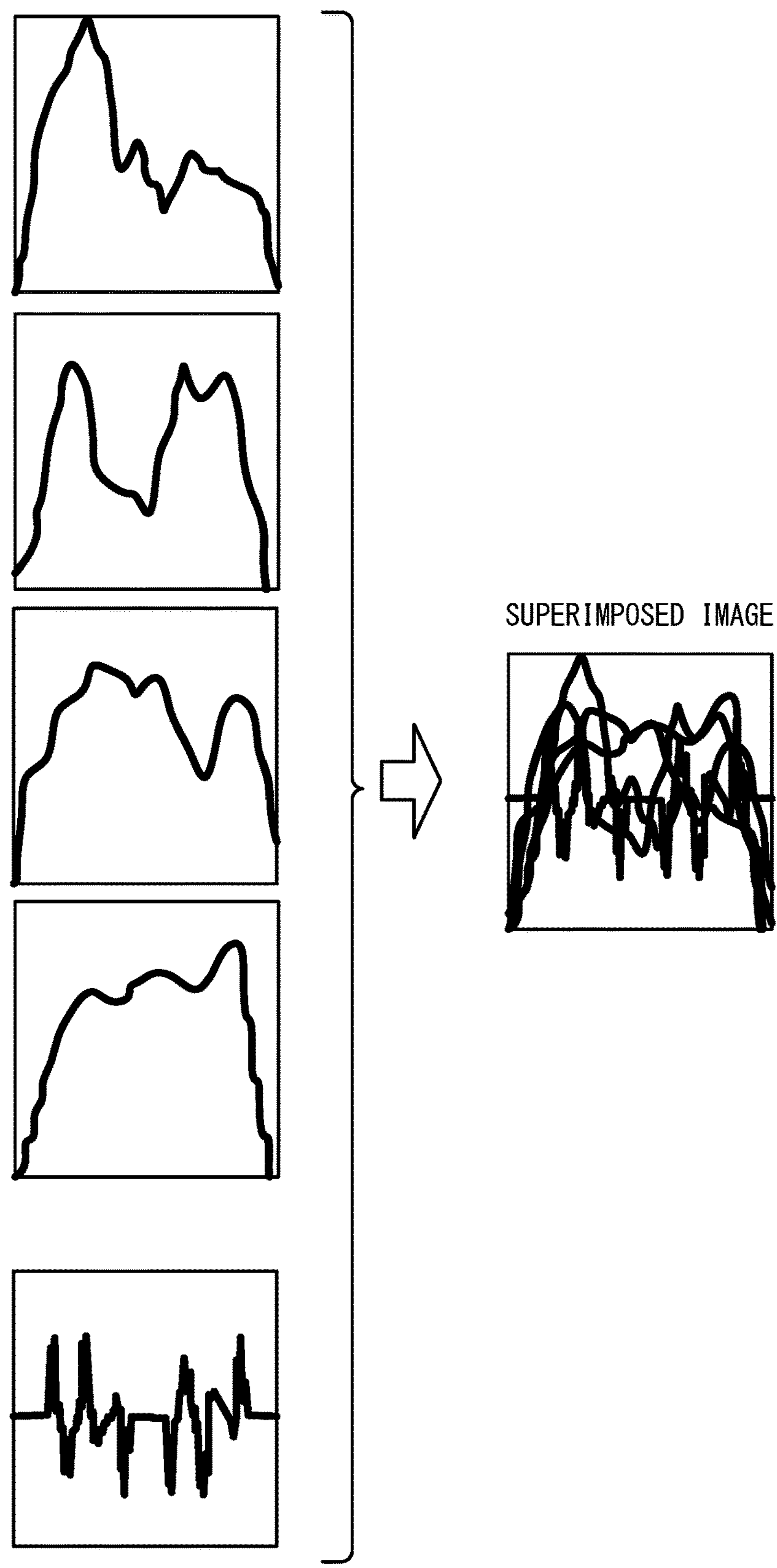
FIG. 8 is a schematic diagram showing an example of the image data generated by the superimposed image generating unit.

FIG. 8 is a schematic diagram showing an example of the image data generated by the superimposed image generating unit 103. Among the images shown in FIG. 8, the five images on the left side are images showing waveforms of the respective time series data pieces obtained by the time series data obtaining unit 101 in the specific example shown in FIG. 7. The first image from the top on the left side is an image of the waveform showing the variable data of the robot 300A. The second image from the top on the left side is an image of the waveform showing the variable data of the robot 300B. The third image from the top on the left side is an image of the waveform showing the variable data of the robot 300C. The fourth image from the top on the left side is an image of the waveform showing the variable data of the robot 300D. The fifth image from the top on the left side is the waveform image showing the test data.

The image obtained by superimposing the waveforms of these images is shown on the right side of FIG. 8. The feature calculating unit 104 calculates a feature of this superimposed image, and the determining unit 105 determines whether an abnormality is present in the product 30 based on the calculated feature.

In this specific example, as described above, the variable data is the time series data of the value indicating the control state for predetermined processing performed on the test object, and the test data is the time series data of the value indicating the state of the test object after the predetermined processing. Thus, it is possible to perform a diagnosis taking processing conditions that affect the state of the processed test object into consideration. Specifically, presence or absence of an abnormality in a result of the processing, i.e., an abnormality in the product 30, can be determined taking the values of the parameters of the robots 300A to 300D at the time of processing into consideration. In this specific example, painting of a car has been used as an example. However, it is not limited to this, and any processing of any products can be diagnosed.

The abnormality diagnosis apparatus 10 according to the embodiment has been described above. The abnormality diagnosis apparatus 10 makes the determination using not only the test data, which is the waveform data of the attribute value dictating whether an abnormality is present in the test object, but also the variable data, which is the waveform data of the variable affecting this attribute value. The determination made by the abnormality diagnosis apparatus 10 can determine whether an abnormality is present in the test object more accurately than the determination using only the attribute value that dictates whether an abnormality is present in the test object. Further, the abnormality diagnosis apparatus 10 determines whether an abnormality is present based on the level of similarity in the image obtained by superimposing the waveforms of the test data and the variable data. Thus, no specific analysis regarding the relationship between the test data and the variable data is necessary, thereby enabling the determination easy.

Note that the present disclosure is not limited to the above-described embodiment, and can be appropriately changed without departing from the spirit of the present disclosure.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. An abnormality diagnosis apparatus for diagnosing a test object for an abnormality, the abnormality diagnosis apparatus comprising:

time series data obtaining means for obtaining test data and variable data, the test data being obtained from the test object over a predetermined period of time and being time series data of a predetermined attribute value that dictates whether an abnormality is present in the test object, and the variable data i) also being obtained from the test object, ii) corresponding to the test data for the predetermined period of time, and iii) being time series data regarding a variable affecting the attribute value;

superimposed image generating means for superimposing a waveform of the test data and a waveform of the variable data to generate superimposed image data; and determining means for determining whether an abnormality is present in the test object based on a level of similarity between the superimposed image data to which an abnormality or normal determination value is given in advance and the superimposed image data generated by the superimposed image generating means.

2. The abnormality diagnosis apparatus according to claim 1, wherein the determining means makes the determination using a determination model learned using the superimposed image data to which the abnormality or normal determination value is given in advance, and the abnormality diagnosis apparatus further comprises determination model updating means for updating the determination model based on a determination result of the test object, which has been subjected to the determination by the determining means, by another abnormality determination method different from a determination method performed by the determining means.

3. The abnormality diagnosis apparatus according to claim 2, wherein the determination model updating means updates the determination model based on a determination result obtained by the other abnormality determination method performed on the test object having the level of similarity less than a predetermined reference value.

4. The abnormality diagnosis apparatus according to claim 1, wherein the test data and the variable data are the time series data during an operation of the test object in the predetermined period of time.

5. The abnormality diagnosis apparatus according to claim 1, wherein the variable data is the time series data of a value indicating a control state for predetermined processing performed on the test object, and the test data is the time series data of a value indicating a state of the test object after the predetermined processing.

6. An abnormality diagnosis method for diagnosing a test object for an abnormality, the abnormality diagnosis method comprising:

obtaining test data and variable data, the test data being obtained from the test object over a predetermined period of time and being time series data of a predetermined attribute value that dictates whether an abnormality is present in the test object, and the variable data i) also being obtained from the test object, ii) corresponding to the test data for the predetermined period of time, and iii) being time series data regarding a variable affecting the attribute value;

superimposing a waveform of the test data and a waveform of the variable data to generate superimposed image data; and determining whether an abnormality is present in the test object based on a level of similarity between the superimposed image data to which an abnormality or normal determination value is given in advance and the generated superimposed image data.

7. The abnormality diagnosis method according to claim 6, further comprising determining whether the abnormality is present in the test object having the level of similarity less than a predetermined reference value by another abnormality determination method different from a determination method based on the level of similarity in the superimposed image data.

8. An abnormality diagnosis apparatus for diagnosing a test object for an abnormality, the abnormality diagnosis apparatus comprising:

a processor programmed to:

obtain test data and variable data, the test data being obtained from the test object over a predetermined period of time and being time series data of a predetermined attribute value that dictates whether an abnormality is present in the test object, and the variable data i) also being obtained from the test object, ii) corresponding to the test data for the predetermined period of time, and iii) being time series data regarding a variable affecting the attribute value;

superimpose a waveform of the test data and a waveform of the variable data to generate superimposed image data; and determine whether an abnormality is present in the test object based on a level of similarity between the superimposed image data to which an abnormality or normal determination value is given in advance and the superimposed image data generated by the processor.

9. The abnormality diagnosis apparatus according to claim 8, wherein the processor is programmed to make the determination using a determination model learned using the superimposed image data to which the abnormality or normal determination value is given in advance, and the processor is further programmed to update the determination model based on a determination result of the test object, which has been subjected to the determination by the processor, by another abnormality determination method different from a determination function performed by the processor.

10. The abnormality diagnosis apparatus according to claim 9, wherein the processor updates the determination model based on a determination result obtained by the other abnormality determination method performed on the test object having the level of similarity less than a predetermined reference value.

11. The abnormality diagnosis apparatus according to claim 8, wherein the test data and the variable data are the time series data during an operation of the test object in the predetermined period of time.

12. The abnormality diagnosis apparatus according to claim 8, wherein the variable data is the time series data of a value indicating a control state for predetermined processing performed on the test object, and the test data is the time series data of a value indicating a state of the test object after the predetermined processing.

13. The abnormality diagnosis apparatus according to claim 8, wherein the abnormality diagnosis apparatus comprises a plurality of processors, and the processor is one of the plurality of processors.

* * * * *